United States Patent [19]

Parrish et al.

[11] 4,371,885
[45] Feb. 1, 1983

[54] CHARGE COUPLED DEVICE IMPROVED MEANDER CHANNEL SERIAL REGISTER

[75] Inventors: William J. Parrish, Santa Barbara; James L. Gates, Vista, both of Calif.

[73] Assignee: Hughes Aircraft Company, Culver City, Calif.

[21] Appl. No.: 274,994

[22] Filed: Jun. 18, 1981

Related U.S. Application Data

[63] Continuation of Ser. No. 83,422, Oct. 10, 1979, abandoned.

[51] Int. Cl.³ .................... H01L 29/78; G11C 19/28; H01L 29/04
[52] U.S. Cl. ................................ 357/24; 307/221 D; 357/59
[58] Field of Search ...................... 357/24; 307/221 D

[56] References Cited

U.S. PATENT DOCUMENTS

| | | | |
|---|---|---|---|
| 3,745,383 | 7/1973 | Sangster | 357/24 |
| 3,858,232 | 12/1974 | Boyle et al. | 357/24 |
| 4,103,347 | 7/1978 | Barton | 357/24 |
| 4,157,588 | 6/1979 | Weckler | 357/24 |
| 4,291,239 | 9/1981 | Weimer | 357/24 LR |

FOREIGN PATENT DOCUMENTS

| | | | |
|---|---|---|---|
| 2716754 | 10/1977 | Fed. Rep. of Germany | 357/24 |
| 7612053 | 5/1977 | Netherlands | 357/24 |

OTHER PUBLICATIONS

Sei et al., "A Meander Channel CCD Linear Image Sensor", IEEE Trans. Electron Devices, vol. ED-25 (2/78), pp. 140–144.
Ohtsuki et al., "CCD with Meander Channel", 3rd. Int. Conf. Tech. and Applications of CCD's, Edinburgh (9/76), Proc. pp. 38–43.

Primary Examiner—Gene M. Munson
Attorney, Agent, or Firm—Robert M. Wallace; William J. Bethurum; William H. MacAllister

[57] ABSTRACT

A meander channel charge couple device having a pair of parallel colinear elongate electrodes extending longitudinally along the length of the register disposed over a meander channel and formed in the same conductive layer so that they both reside at the same height above the semiconductor substrate, thereby providing a symmetrical surface potential distribution. Charge transfer instabilities beneath a gap separating the electrodes are eliminated by providing an additional set of electrodes, each extending transversely to the meander channel and to the first pair of parallel electrodes and spanning the gap. Contact is made by each of the longitudinal electrode pairs to alternate ones of the transverse electrodes and a two-phase clock system is applied to the longitudinal electrode pair.

14 Claims, 23 Drawing Figures

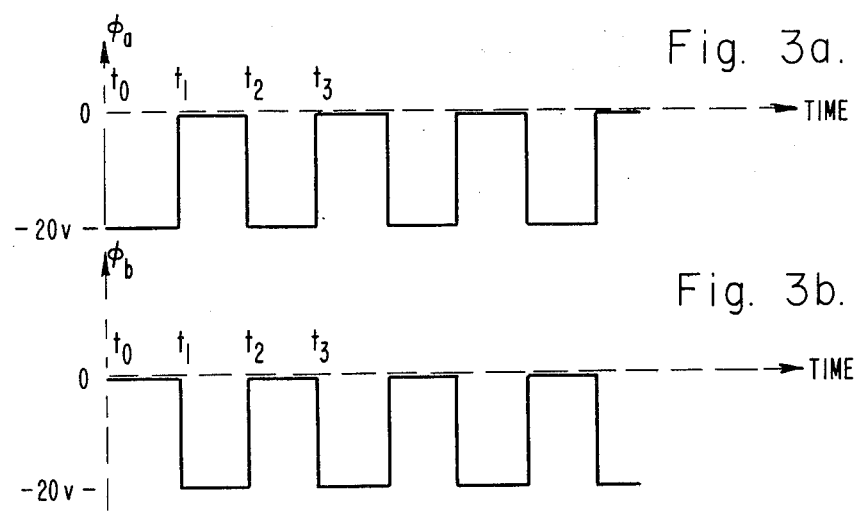
Fig. 3a.
Fig. 3b.
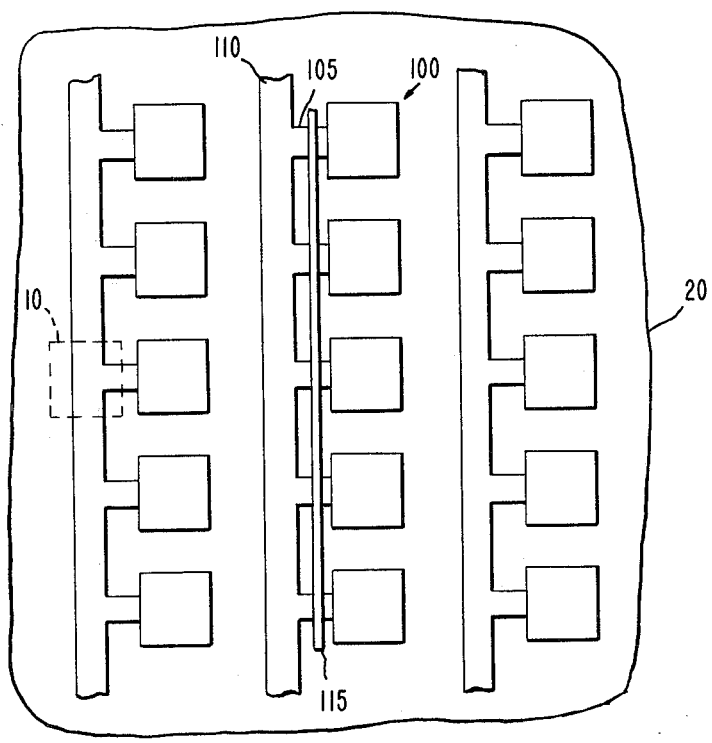
Fig. 2.

CHARGE COUPLED DEVICE IMPROVED MEANDER CHANNEL SERIAL REGISTER

This is a continuation of application Ser. No. 083,422, filed Oct. 10, 1979, now abandoned.

TECHNICAL FIELD

This invention is a meander channel charge coupled device (CCD) and relates to CCD serial storage registers.

RELATED APPLICATIONS

This application is related to a U.S. patent application Ser. No. 236,415, filed Feb. 20, 1981 which is a continuation of Ser. No. 083,426 Filed Oct. 10, 1979 and now abandoned by Parrish and Fletcher and entitled, "Charge Coupled Device Focal Plane with Serial Register having Interdigitated Electrodes", and assigned to the assignee of the present invention.

BACKGROUND ART

A charge coupled device having a meander channel is disclosed in Ohtsuki et al, "CCD With Meander Channel," *Third International Conference on Technology and Applications of CCD's*, 1976, pages 38–43. The Ohtsuki publication discloses a CCD having channel stops which define a meander channel in which charge transfer is controlled by two parallel linear electrodes disposed side-by-side over the meander channel and parallel to the channel. The electrodes are clocked by opposite phases of a two-phase clocking system. The disadvantage of such a device is that, if the electrodes overlap, they must be formed in different layers over the charge coupled device, so that they are mutually insulated. As a result, the two electrodes must be disposed at different heights over the charge flow channel, which creates an unsymmetrical surface potential distribution in the device. On the other hand, if the two linear electrodes are formed in the same conductive layer over the substrate, there must be an insulating gap between the two electrodes so that the two electrodes remain insulated from one another. As a result, no electrode directly overlies the gap, which causes instability in charge transfer under the gap.

SUMMARY OF THE INVENTION

This invention includes a novel serial register which provides symmetrical surface potential distribution, and eliminates the gap instability in charge transfer discussed above in connection with the meander channel device of the Ohtsuki publication.

The serial register is a meander channel charge coupled device having a pair of parallel colinear elongate electrodes extending along the length of the register disposed over a meander channel and formed in the same conductive layer so that they both reside at the same height above the semiconductor substrate, thereby providing a symmetrical surface potential distribution. Charge transfer instabilities beneath a gap separating the parallel electrodes are eliminated, by providing an additional set of electrodes disposed transversely to the meander channel and to the first pair of parallel electrodes and spanning the gap. In the preferred embodiment of the invention, a two phase clock system is used in which the electrodes controlling charge transfer in the left half of the channel are controlled by the first clock phase while the electrodes controlling charge transfer in the right half of the meander channel are controlled by the second clock phase.

BRIEF DESCRIPTION OF THE DRAWINGS

The invention is best understood by reference to the accompanying drawings, of which:

FIG. 2 is a plan view of a CCD monolithic focal plan array incorporating the device of FIG. 1.

FIG. 3 illustrates the time domain wave forms of the two-phase clock signals used in the invention;

DETAILED DESCRIPTION OF THE INVENTION

Figure 1A:
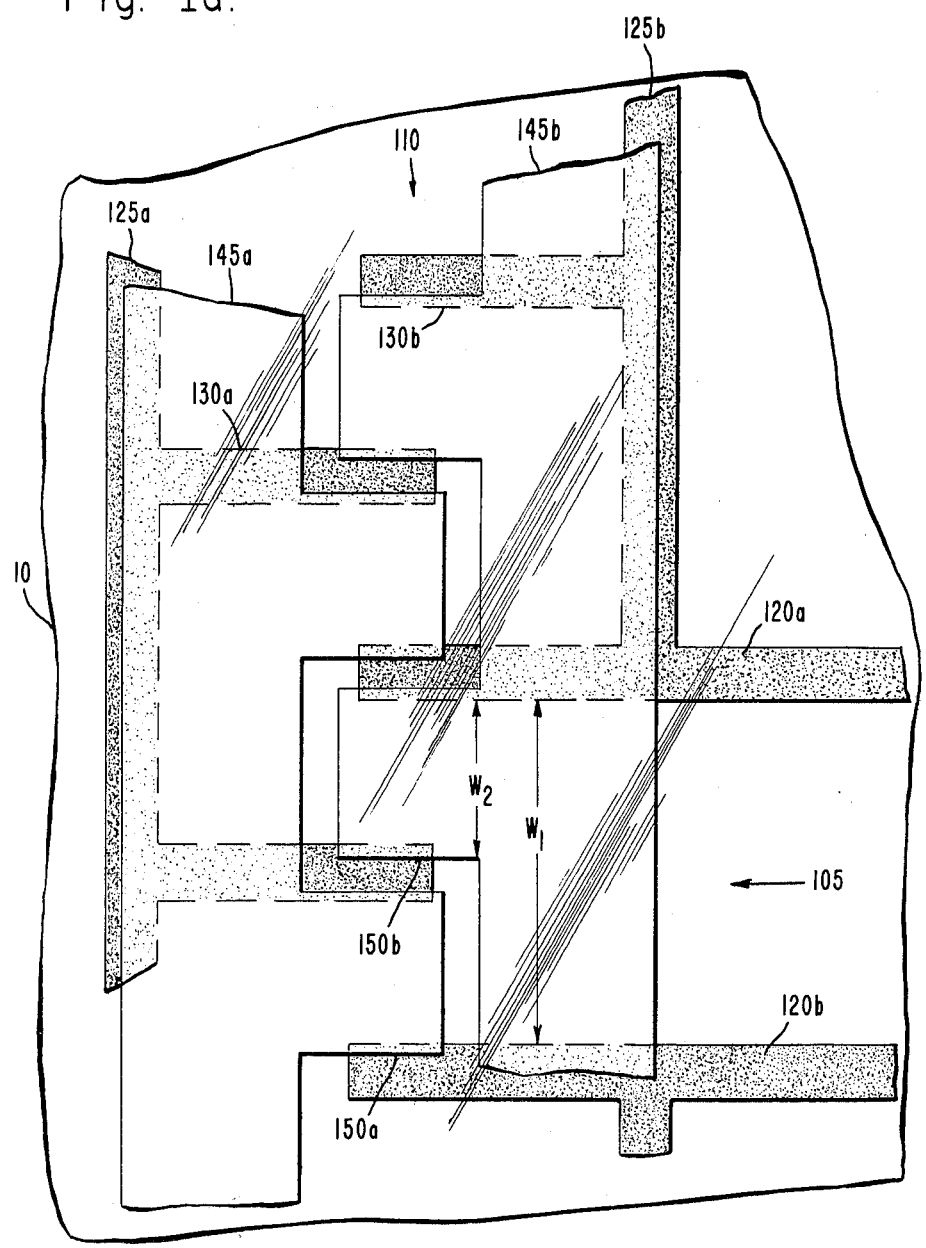
FIG. 1a is a plan view of a related meander channel register after formation of the channel stops and deposition of the lower level electrodes before completion.
Figure 1B:
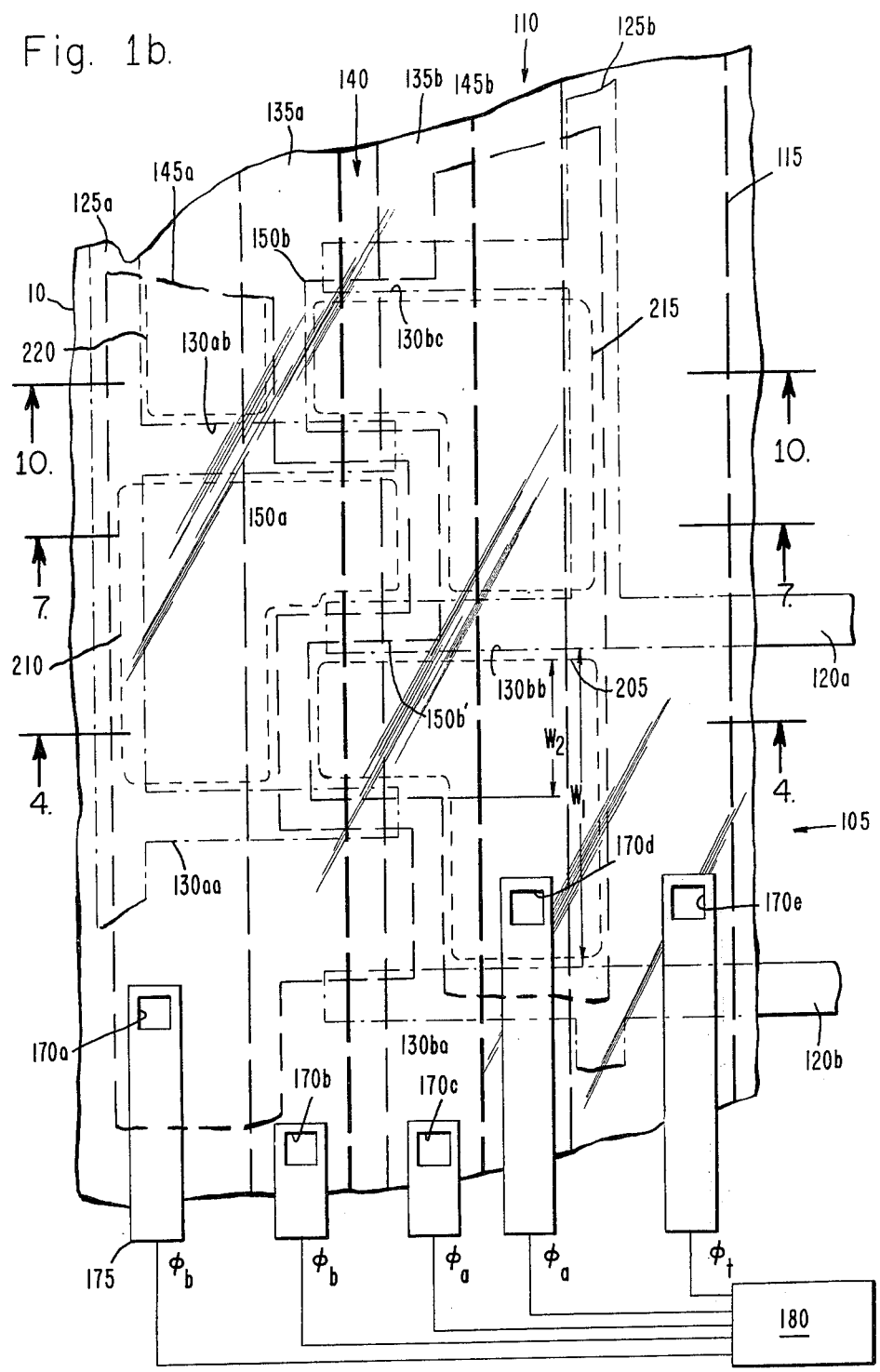
FIG. 1b is a top plan view corresponding to FIG. 1a illustrative of a completed device.
Figure 5:
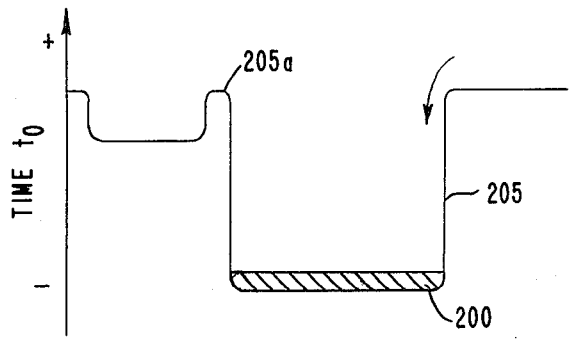
FIG. 5 is a plot of the surface potential corresponding to the cross-sectional view of FIG. 4 at time $t_0$ of FIG. 3.

FIGS. 1a and 1b are plan views of a meander channel CCD (which is the subject of the above-referenced related application) utilized as a serial register in the CCD monolithic focal plane array illustrated in FIG. 2, and are enlarged views of a portion 10 of the focal plane array of FIG. 2, in which a plurality of photodetectors 100 provide charge coupled image sensing of the type discussed in Seguin et al, *Charge Transfer Devices*, Academic Press, 1975, page 144, FIG. 5.1d. Referring to FIG. 2, each detector 100 is formed over a semiconductive substrate 20 and generates charge packets which are transferred through a side flow channel 105 into one side of serial register 110 under the control of a transfer gate 115.

FIG. 1a illustrates the meander channel serial register of this invention as it appears in the early stages of fabrication, while FIG. 1b illustrates the register after completion of fabrication. FIG. 1a shows that the side channel 105 is defined by a pair of elongate parallel channel stops 120a, 120b extending from left to right in the drawing of FIG. 1a. The serial register 110 is defined by a pair of longitudinally extending elongate channel stops 125a, 125b each having interdigitated right and left finger portions 130a, 130b respectively.

Referring now to FIG. 1b, a pair of conductive electrodes 135a, 135b (not shown in FIG. 1a) are disposed longitudinally in the right and left hand portions, respectively, of the serial register 110, insulated from the semiconductive substrate in the same conductive layer and separated from one another by a gap 140 insulating the electrodes 135a, 135b from one another. As discussed above in connection with the Ohtsuki publication, charge transfer in the substrate directly beneath the gap 140 will be unstable in the absence of electrodes other than the electrodes 135. One solution to this problem, as discussed above, was to have the electrodes 135a overlie the other electrodes 135b. However, this would require that the two electrodes 135 be disposed in different conductive layers in order to maintain insulation between the electrodes 135. As a result, the surface potential beneath the electrodes 135 would not be symmetrical, due to the different heights at which the electrode pair 135 would be disposed.

In this invention, the foregoing difficulties are overcome by first forming a pair of electrodes 145a, 145b (best shown in FIG. 1a) in a lower insulated layer and thereafter forming the electrode pair 135 in an upper insulated layer at a uniform height above the substrate (best shown in FIG. 1b). The lower electrodes 145a, 145b overlie the right and left hand portions respectively of the meander channel serial register 110 and have interdigitated finger portions 150a, 150b, respectively, underlying the gap 140 which serve to control charge transfer beneath the gap 140 and reduce charge transfer instabilities beneath the gap 140.

Figure 4:
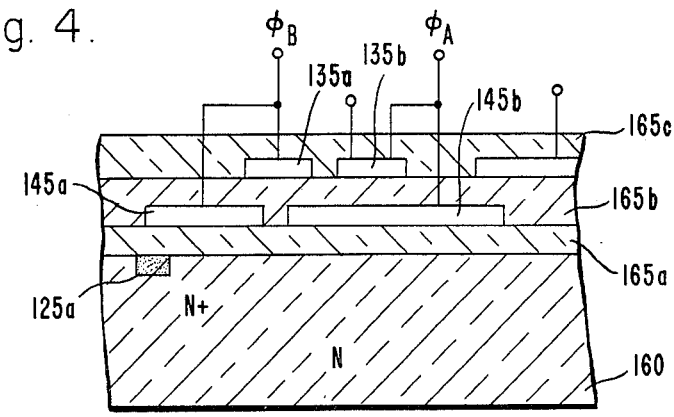
FIG. 4 is a simplified cross-sectional view of the device of FIG. 1b taken along lines 4—4 of FIG. 1b.

Referring now to the cross-sectional view of FIG. 4, it is seen that the meander channel device of FIG. 1 overlies a semiconductive substrate 160 of N-type conductivity. The channel stop 125a is an implanted or diffused material of increased N-type conductivity in the top surface of the substrate 160 or a field control plate acting as a channel stop as discussed in D. D. Buss, "Infared Monolithic HgCdTe I.R. CCD Focal Plane Technology," 1978 *International Electron Device Meeting*, Washington, D.C. Dec. 4, 5, 6 (1978) Pages 496–500. A first insulating oxide layer 165a overlies the entire top surface of the substrate 160. The lower level electrodes 145a, 145b are etched in a first conductive layer of polysilicon overlying the first layer of thin oxide 165a. A second layer of thin oxide 165b overlies the first polysilicon layer of electrodes 145a, 145b. Disposed over the second layer of thin oxide film 165b are the elongate linear electrodes 135a, 135b, and the transfer electrode 115 in a second layer of polysilicon. Referring to FIG. 1b, it is seen that charge transfer from the side channel 105 to the meander channel serial register 110 occurs across the entire width W1 illustrated in FIG. 1 under the control of the transfer electrode 115. In contrast, if a prior art straight channel CCD serial register were used in place of the meander channel CCD register 110 of FIG. 1, charge transfer under the transfer electrode 115 would occur across the much narrower width W2 of one electrode gate in the prior art straight channel CCD register. The increase in width of W2 over W1 corresponds to a significant increase in charge transfer efficiency at the interface between the side channel 105 and the serial register 110.

A third layer of thin oxide film 165c is deposited on top of the upper level electrodes 135a, 135b and over the second layer of oxide 165b, as shown in FIG. 4. Referring to FIG. 1b, a plurality of contacts 170 are cut through the oxide layers 165 to provide an opening to each one of the electrodes. For example, contact 170a is cut through thin oxide layers 165b and 165c to expose a portion of electrode 145a. A layer of metallization is deposited over top oxide layer 165c after formation of the plurality of contacts 170 to form a plurality of conductors 175 which make connection through the plurality of contacts 170 to each of the individual electrodes 135, 145, connecting them to clock pulse generator 180. There being five discrete electrodes in the meander channel device of FIG. 1, only five contacts 170a–e are necessary for the clock pulse generator 180 to effect charge transfer along the entire length of the meander channel device 110 of FIG. 1, regardless of the length of the device, greatly simplifying fabrication. Advantageously, none of the conductors 175 overlies any electrode which is connected to another conductor, so that pin holes in any of the thin oxide layers 165 will not have as great a probability of destroying device operation as in charge coupled devices of the prior art.

FIG. 1 shows the preferred clocking scheme of the meander channel device 110 in which the electrodes overlying the left hand portion of the register 110, namely electrodes 145a and 135a, are connected by conductors 175a and 175b to one phase, $\phi_b$, of the clock pulse generator 180. Likewise, electrodes controlling charge transfer in the right hand portion of the channel 110, namely electrodes 135b and 145b, are connected by conductors 175c and 175d respectively to the other phase $\phi_a$, of the clock pulse generator, 180. A separate clock signal, $\phi_t$, is applied through conductor 175e to transfer gate electrode 115.

Figure 6:
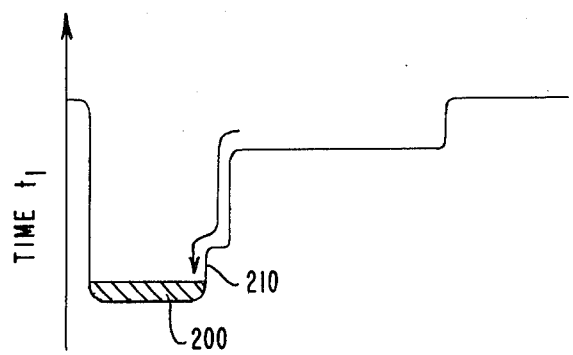
FIG. 6 is a plot of the surface potential corresponding to the cross-sectional view of FIG. 4 at time $t_1$ of FIG. 3.

Operation of the device of FIG. 1 will now be described by reference to FIGS. 3–12. FIGS. 3a and 3b illustrate time domain waveforms of the two clock signals $\phi_a$ and $\phi_b$, respectively. Initially, at time $t_0$ of FIG. 3, $\phi_a$ is minus 20 volts while $\phi_b$ is approximately zero volts. FIG. 5 is a diagram of the electrical surface potential in the substrate 160 corresponding to the cross-sectional view of FIG. 4 at time $t_0$ of FIG. 3 and shows that the surface potential $\phi_s$ is most negative in the region directly underlying electrode 145b in the cross-sectional view of FIG. 4, defining a potential well 205 in the surface potential $\phi_s$. The extent of the potential well 205 is approximately indicated in FIG. 1b by a dashed line in the right hand portion of the register 110, and underlies that portion of electrode 145b which is bounded by channel stop fingers 130b-a and 130b—b. At time $t_0$, a positive charge packet 200 is transferred from the side channel 105 under transfer electrode 115 into the register channel 110, and falls into the potential well 205, as illustrated in FIG. 5. Subsequently, at time $t_1$ the clock signal $\phi_b$ switches to negative 20 volts while the clock signal $\phi_a$ switches to zero volts, and the configuration of the surface potential $\phi_s$ changes accordingly at time $t_1$ to the configuration illustrated in the plot of FIG. 6. FIG. 6 shows that the surface potential $\phi_s$ at time $t_1$ is lowest in a region directly underlying electrode 145a, defining a new potential well 210 into which the charge packet 200 now falls. The extent of the new well 210 is approximately indicated in FIG. 1b by a dashed line in the left hand portion of the register 510 and underlies that portion of the electrode 145a which is bounded by channel stop fingers 130a—a and 130a-b.

Figure 7:
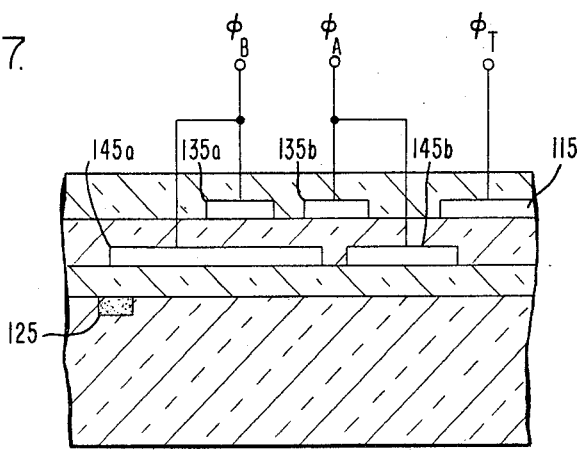
FIG. 7 is a simplified cross-sectional view of the device of FIG. 1b taken along lines 7—7 of FIG. 1b.
Figure 8:
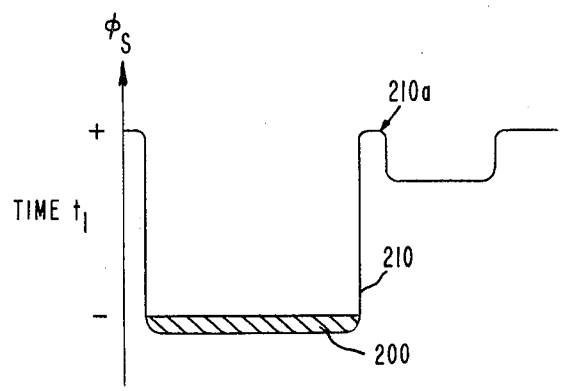
FIG. 8 is a plot of the surface potential corresponding to the cross-sectional view of FIG. 7 at time $t_1$ FIG. 3.
Figure 9:
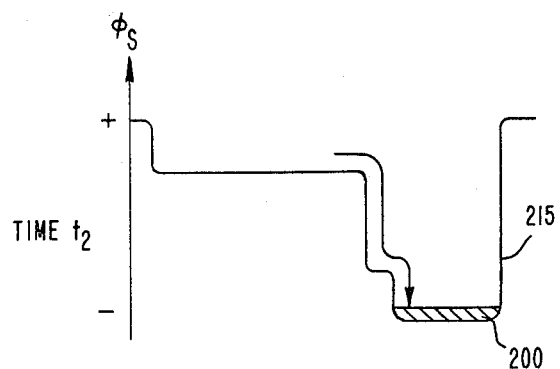
FIG. 9 is a plot of the surface potential corresponding to the cross-sectional view of FIG. 7 at time $t_2$ of FIG. 3.

FIG. 7 is a simplified cross-sectional view of FIG. 1 taken along lines 7—7 of FIG. 1. FIG. 8 is a diagram of the surface potential $\phi_s$ in the substrate 165 at time $t_1$ of FIG. 3 corresponding to the cross-sectional view of FIG. 7 and showing the potential well 210 also seen in FIG. 6. At time $t_2$ of FIG. 3, the clock signals $\phi_a$ and $\phi_b$ change again and the electrical surface potential $\phi_s$ changes to the configuration illustrated in the plot of FIG. 9 corresponding to the cross-sectional view of FIG. 7 at time $t_2$ of FIG. 3. FIG. 9 shows that the electrical surface potential $\phi_s$ at time $t_2$ is lowest in a region directly underlying electrode 145b, thereby defining another potential well 215 into which the charge packet 200 falls. The extent of the potential well 215 is illustrated in FIG. 1 by a dashed line in the right hand portion of the register 510 and underlies the portion of the electrode 145b which lies between channel stop fingers 130b—b and 130b-c.

Thus, the charge packet 200 travels in an upward direction in the illustration of FIG. 1 from the first potential well 205 to the second potential well 210 at time $t_2$. The charge packet is prevented from traveling in the opposite ("downward") direction at time $t_2$, because the surface potential $\phi_s$ corresponding to the cross-sectional view of FIG. 4 returns to the configuration illustrated in FIG. 5 at time $t_2$. A potential barrier 205a shown in FIG. 5 prevents charge stored in the second potential well 200. The potential barrier 205a underlies the gap between the electrodes 145a and 145b. The charge is thus constrained to move in one direction only in the meander channel 110.

Figure 10:
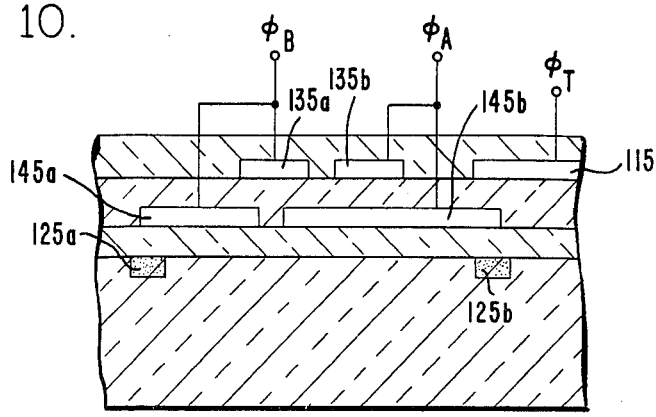
FIG. 10 is a simplified schematic cross-sectional view of the device in FIG. 1b taken along lines 10—10 of FIG. 1b.
Figure 11:
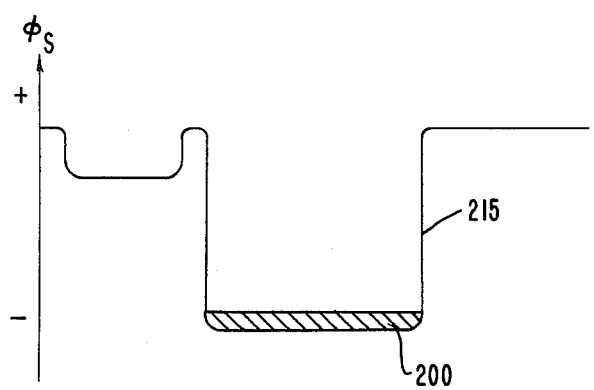
FIG. 11 is a plot of the surface potential corresponding to the cross-sectional view of FIG. 10 at time $t_2$ of FIG. 3.
Figure 12:
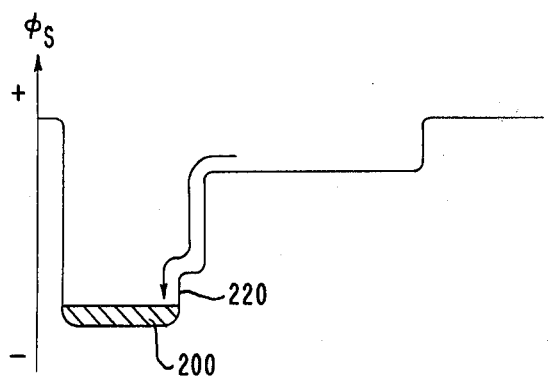
FIG. 12 is a plot of the surface potential corresponding to the cross-sectional view of FIG. 10 at time $t_3$ of FIG. 3.

FIG. 10 is a simplified cross-sectional view of the device of FIG. 1 taken along lines 10—10 of FIG. 1. FIG. 11 is a diagram of the electrical surface potential $\phi_s$ of the substrate 165 corresponding to the cross-sectional view of FIG. 10 at time $t_2$. At time $t_3$ of FIG. 3, the clock signals $\phi_a$ and $\phi_b$ change again, and the configuration of the surface potential $\phi_s$ changes to a new configuration illustrated in the plot of FIG. 12 corresponding to the cross-sectional view of FIG. 10. FIG. 12 shows that the surface potential $\phi_s$ at time $t_3$ is most negative in a region directly underlying electrode 145a, thereby defining a potential well 220. The extent of the potential well 220 is partially indicated by a dashed line in FIG. 1 in the left hand portion of the register 510 and underlies the portion of the electrode 145a above channel stop fingers 130a,b.

It is to be understood that FIG. 1 is a view of only a portion of the meander channel device of this invention, and that the structure illustrated in FIG. 1 extends along the entire length of the register 110 shown in FIG. 2, while the operation discussed above in connection with FIGS. 3-12 is repeated simultaneously along the entire length of the register 110. For example, while FIGS. 3-12 illustrate a transfer of a single charge packet 200 which enters from side channel 105, it should be understood that other charge packets are transferred simultaneously in the same manner through the other plurality of side channels 105 illustrated in FIG. 2 and transferred serially down the register 110 alternating between the right and left hand portions of the register 110 in a meandering path.

The two-phase clocking arrangement discussed above in connection with FIGS. 1-12 causes the positive charge packets to flow in a generally upward direction in the drawing of the channel 110 in FIG. 1 as mentioned previously. However, it is entirely within the scope of this invention to provide a clocking scheme which may be either two-phase or four-phase, or in which the direction of charge flow is opposite ("downward"). For example, if the clock signal $\phi_a$ were connected to lower level electrode 145a and upper electrode 135b, while clock signal $\phi_b$ were connected to lower level electrode 145b and upper level electrode 135a, the direction of charge flow would be opposite to that of the charge flow process discussed above in connection with FIGS. 3-12.

Figure 13:
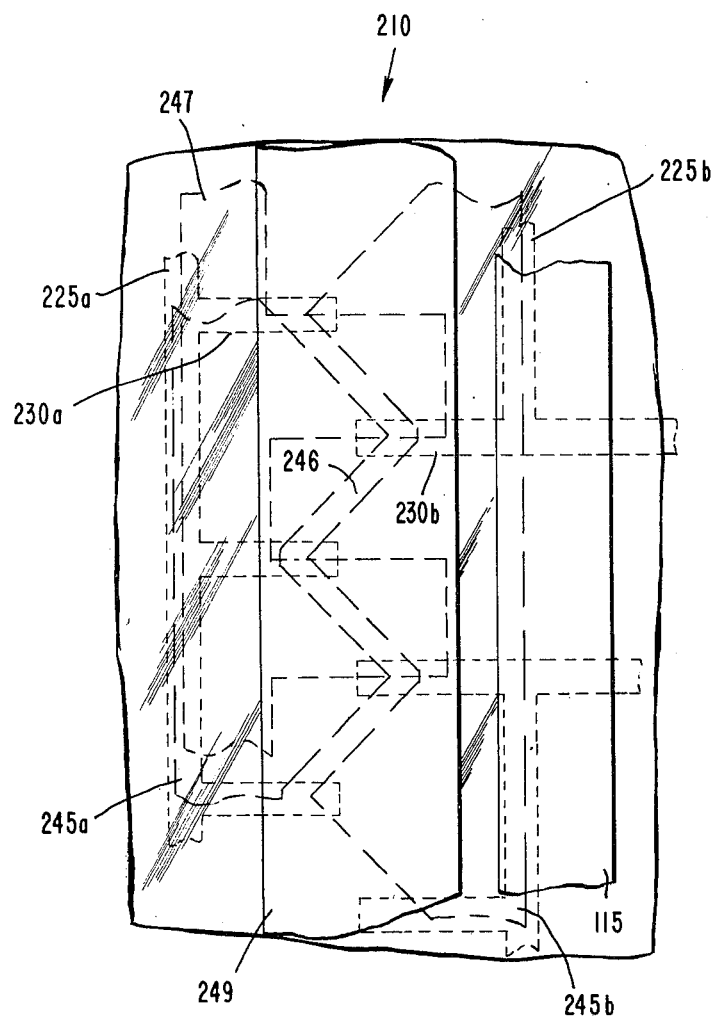
FIG. 13 is a plan view of a first alternative embodiment of the species of FIG. 1.

FIG. 13 is a top plan view of a first alternative embodiment of the species of FIG. 1 including a meander channel CCD register 210 defined by parallel channel stops 225a,b having fingers 230, charge packets being transferred in the register 210 along an oblique meander path. The configuration of the channel stops 225a,225b is similar to the configuration of channel stops 125a,125b of FIG. 1. In the alternative embodiment of FIG. 13, electrodes 245a, 245b corresponding to the electrodes 135a, 135b of FIG. 1 but having interdigitated triangular fingers separated by a gap 246, are formed in a first insulated layer of polysilicon overlying the semiconductive substrate. An electrode 247 corresponding to the electrode 145a of FIG. 1 is formed in a second insulated layer of polysilicon, and is a linear conductor extending parallel to the channel stop 225a and having a plurality of rectangular fingers 248 corresponding to the fingers 150a of FIG. 1 extending over alternate portions of the gap 246 to control and stabilize charge transfer beneath these portions. A rectangular electrode 249 is formed in a third insulated layer of polysilicon and overlies the entire gap 246 to control and stabilize charge transfer beneath the remaining portions of the gap 246. Alternate portions of the straight electrode 249 overlie regions not covered by the electrode fingers 248 and therefore are functionally equivalent to the fingers 150b of FIG. 1. A two-phase clock system such as that discussed in FIG. 1 may be used to effect charge transfer in the same manner as discussed above in connection with FIGS. 3-12. Thus, the clock signal $100_b$ is applied to the electrodes and 245a and 247 in the left half of the register 210 while the clock signal $\phi_a$ is applied to the remaining electrodes 245b and 249.

Figure 14:
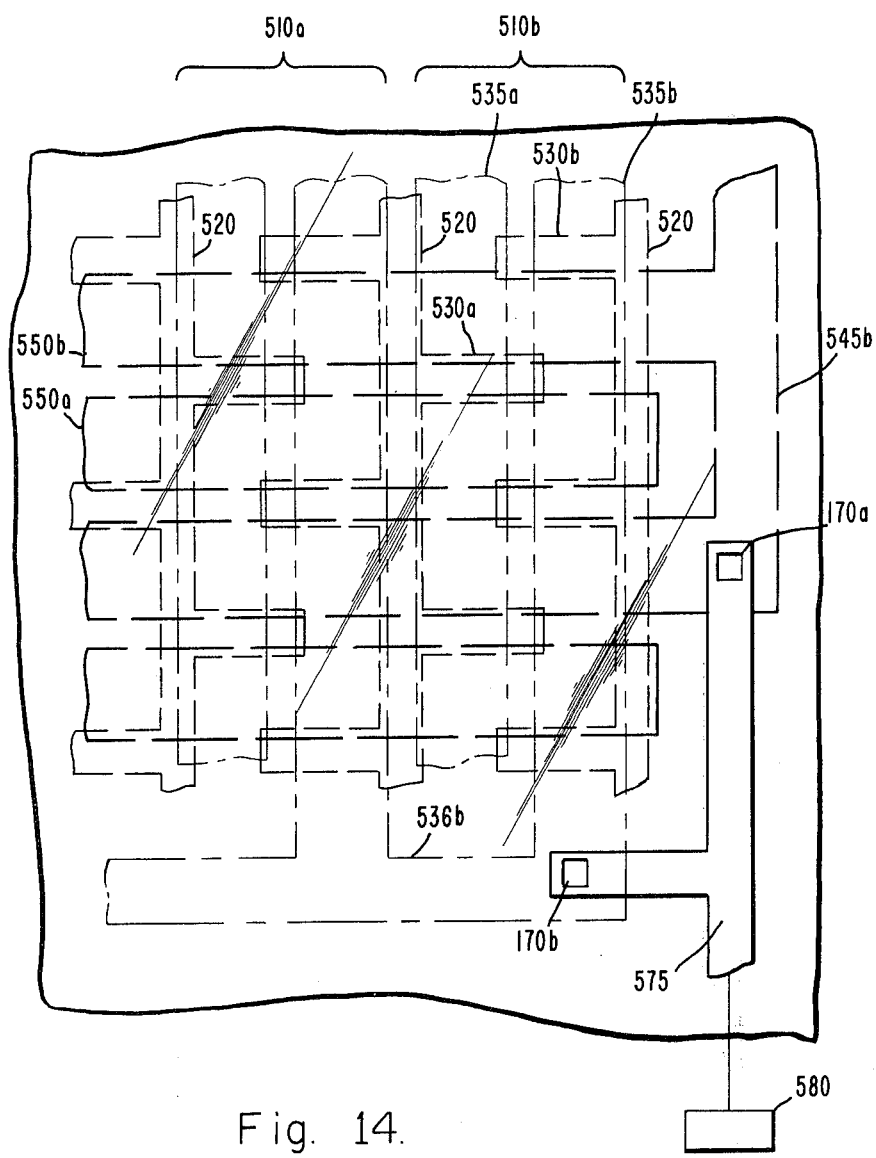
FIG. 14 is a plan view of a CCD parallel memory array having interdigitated electrodes constructed in accordance with the species of FIG. 1.

FIG. 14 is a plan view of a portion of a meander channel charge coupled device parallel memory array useful in a CCD series-parallel-series memory such as that disclosed in Sequin et al, *Charge Transfer Devices,* Academic Press, N.Y., 1975, pages 243-247, and includes a plurality of meander channel serial registers 510 of the type illustrated in FIG. 1 defined by a plurality of parallel channel stops 520. Each of the plurality of registers 510 includes a first plurality of channel stop fingers 530a extending from one of the channel stops 520 interdigitated with a second plurality of channel stop fingers 530b extending from an adjacent channel stop 520. A first plurality of electrode fingers 550b formed in a first insulated conductive layer extends across all registers 510 from a single electrode 545b disposed to one side of the memory. Interdigitated with the first plurality of electrode fingers 550b is a second plurality of fingers 550a which similarly extend across all registers 510 from another electrode 545a (not shown) disposed along an opposite side (not shown) of the memory.

A plurality of right hand electrodes 535b formed in a second conductive layer insulated from the first conductive layer extend over the right half of each of the plurality of registers 510 in a direction parallel to the registers 510 from a single electrode 536b disposed along the bottom end of the array of registers 510. Similarly, a plurality of left hand electrodes 535a formed in the second conductive layer extend over the left half of each of the plurality of registers 510 in a direction parallel to the registers 510 from a single electrode 536a (not shown) disposed along the top end (not shown) of the memory. FIG. 14 shows contacts 170a, 170b connecting the electrodes 545b and 536b respectively through a metal conductor 575 to clock pulse generator 580, which controls charge transfer throughout the entire parallel memory array of FIG. 14 through the two contacts 170a and 170b in the lower right hand corner of the parallel array of FIG. 14. It is to be understood that the upper left hand corner (not shown) of the parallel memory array has a corresponding pair of contacts 170c, 170d (not shown) connecting the clock pulse generator 580 to the electrodes 535a and 545a (not shown). Thus, only four contacts 170 are required for the clock pulse generator 580 to control charge transfer throughout the entire device. Charge transfer in each of the registers 510 is performed in the same manner as described above in connection with FIGS. 3–12.

Figure 15:
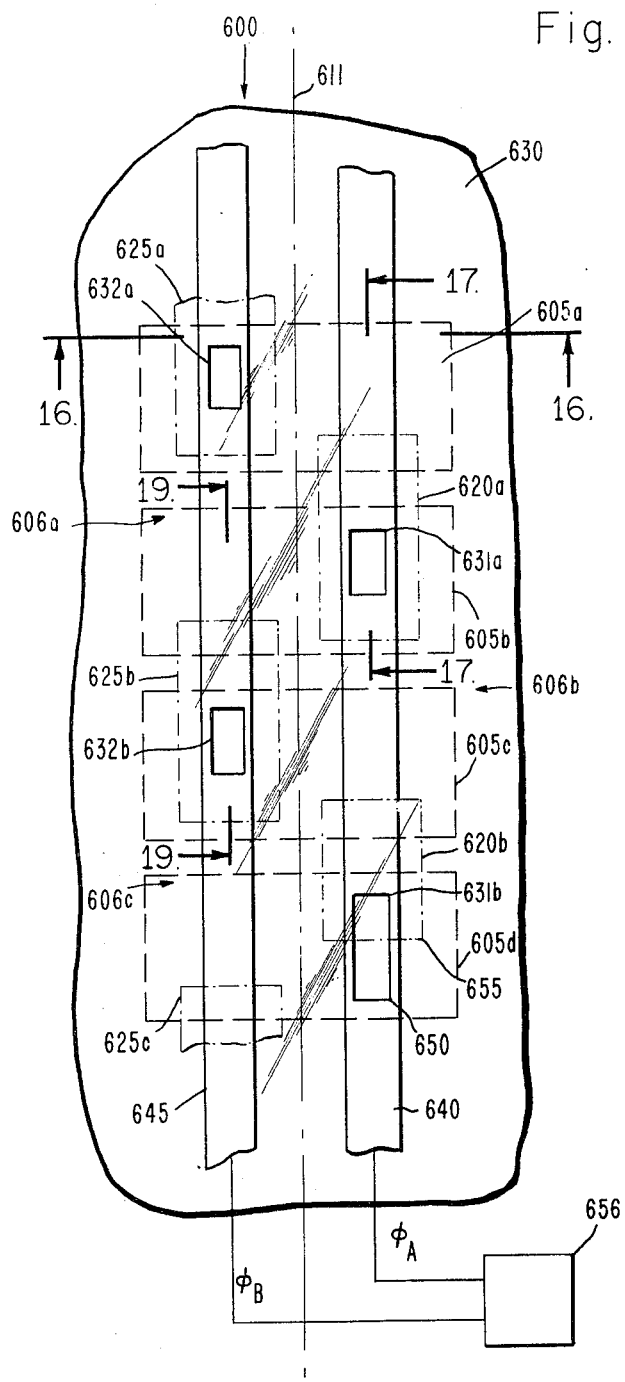
FIG. 15 is a top plan view of one species of the present invention claimed in this application.

FIG. 15 is a plan view of the species of the present invention which is claimed in this application. Although the species of FIG. 15 is not necessarily intended for use in monolithic focal plane arrays, it does provide some of the advantages realized in the species of FIG. 1 including symmetrical distribution of surface potential across the meander channel device and stabilization of charge transfer in the vicinity of gaps between electrodes. One feature of the species of FIG. 15 is that more room is provided for the formation of contacts, thereby relaxing the requirement for mask alignment accuracy.

Figure 16:
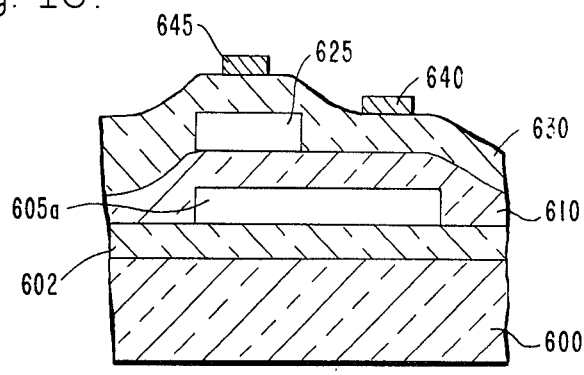
FIG. 16 is a simplified cross-sectional view of the device of FIG. 15 taken along lines 16—16 of FIG. 15.
Figure 17:
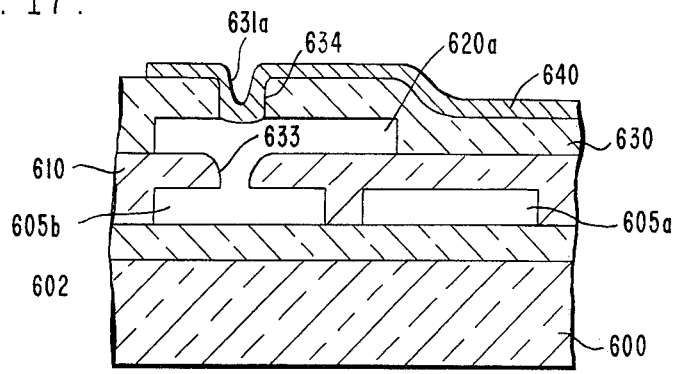
FIG. 17 is a simplified cross-sectional view of the device of FIG. 15 taken along lines 17—17 of FIG. 15.
Figure 19:
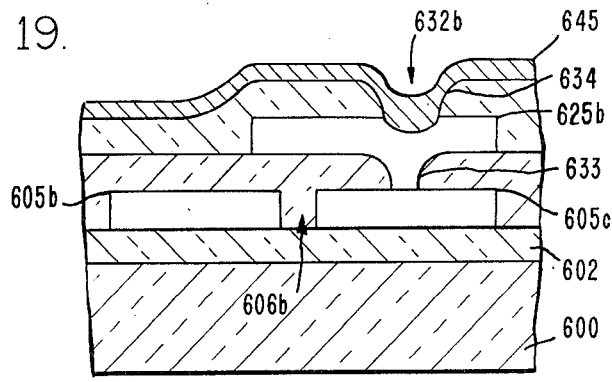
FIG. 19 is a simplified cross-sectional view of the device of FIG. 15 taken along lines 19—19 of FIG. 15.

Referring to FIG. 15 and the cross-sectional view of FIG. 16, a meander channel CCD serial register 600 is formed on the surface of a semiconductive substrate 601 of N-type conductivity having a first insulating layer 601 of oxide. A plurality of lower level electrodes 605 separated by insulating gaps 606 is formed with the deposition of a first layer of polysilicon, over which a second layer 610 of oxide is deposited. Each of the electrodes 605 extends transversely with respect to an imaginary center line 611 dividing each of the lower level electrodes 605 into right and left hand portions. A plurality of right hand upper level electrodes 620a, 620a, 620b, and a plurality of left hand upper level electrodes 625a, 625b, 625c are formed in an upper layer of polysilicon, over which a top layer 630 of oxide is deposited. Each of the plurality of right hand upper level electrodes 620 partially overlies the right hand portions of alternate pairs of adjacent lower level electrodes 605 and spans each gap 606 therebetween. The plurality of left hand upper level electrodes 625 partially overlie the left hand portions of the remaining pairs of adjacent lower level electrode 605, spanning the remaining gaps 606 therebetween. The gap 606a shown in FIG. 17 is spanned by right hand upper level electrode 620a, and the gap 606b shown in FIG. 19 is spanned by left hand upper level electrode 625b.

Figure 18:
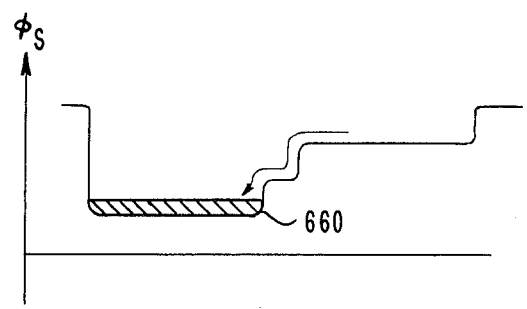
FIG. 18 is a plot of the surface potential corresponding to the cross-sectional view of FIG. 17 at time $t_0$ of FIG. 3.

As shown in FIG. 15, a first plurality of contacts 631 overlie the right hand portions of alternate lower level electrodes 605b, 605d, and a second plurality of contacts 632 overlie the left hand portions of the remaining lower level electrodes 605a, 605c. Referring to FIGS. 17, 18 and 19, each contact 631, 632 is formed by a lower level contact 633 etched through the second layer of oxide 610 and an overlying upper level contact 634 etched through the top oxide layer 630. Elongate metal conductors 640, 645 shown in FIGS. 17 and 16 are deposited over the top oxide layer 630 to overlie the right and left hand portions respectively of lower level electrodes 605. The contacts 631 permit connection of the right hand conductor 640 with the right hand plurality of upper level electrodes 620 and alternate ones of the lower level electrodes 605b, 605d, while the contacts 632 permit connection between the left hand conductor 645 with the left hand plurality of upper level electrodes 625 and the remaining ones of the lower level electrodes 605a, 605c. Optionally, each of the contacts 631, 632 may take the form a split contact 650 shown in FIG. 15 which partially overlies upper level electrode 620b along one of its edges 655 in a manner well-known in the art.

A clock pulse generator 656 generates clock pulses $\phi_a$, $\phi_b$, illustrated in FIGS. 3a and 3b respectively, which are applied through conductors 640, 645 respectively to provide a two-phase CCD structure.

Figure 20:
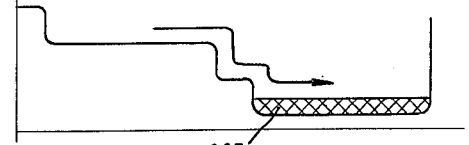
FIG. 20 is a plot of the surface potential corresponding to the cross-sectional view of FIG. 19 at time $t_1$ of FIG. 3.

Operation of the serial register of FIG. 15 will now be described by reference to FIGS. 3 and 17 through 20. At time $t_0$ of FIG. 3, the clock signal $\phi_a$ is pulsed negatively while the clock signal $\phi_b$ is at approximately zero volts potential and the resulting electrical surface potential $\phi_s$ in the substrate is illustrated in FIG. 18 corresponding to the cross-sectional view of FIG. 17. The clock signal $\phi_a$ is applied from the conductor 640 through contact 631a to right hand upper level electrode 620a to reduce the surface potential $\phi_s$ beneath the gap 606a and to lower level electrode 605b to form a potential well 660 in the surface potential $\phi_s$, illustrated in FIG. 18. Reduction of the surface potential $\phi_s$ beneath the gap 606a by upper level electrode 620a stabilizes charge transfer in the vicinity of the gap 606a. A positive charge packet previously held beneath lower level electrode 605a will be attracted beneath right hand upper level electrode 620a across the gap 606a into the potential well 660 at time $t_0$. Subsequently, at time $t_1$ of FIG. 3, the clock signal $\phi_a$ is at zero volts while the clock signal $\phi_b$ is pulsed negatively and the resulting surface potential $\phi_s$ is illustrated in FIG. 20 corresponding to the cross-sectional view of FIG. 19. As a result, the positive charge packet previously stored beneath the right hand portion of lower level electrode 605b flows under the left hand portion of electrode 605b, crosses the gap 606b under the left hand upper level electrode 625b and falls into the potential well 665 illustrated in FIG. 20 at time $t_1$. Subsequently, at time $t_2$ when $\phi_a$ is again pulsed negatively, the charge packet will again be transferred from left to right across the center line 611 to cross the gap 606c under the right hand upper level electrode 620b, and the entire cycle will continue to repeat itself as the charge progresses down the serial register of FIG. 15 meandering between the left and right hand portions of the lower level electrodes 605.

Figure 21:
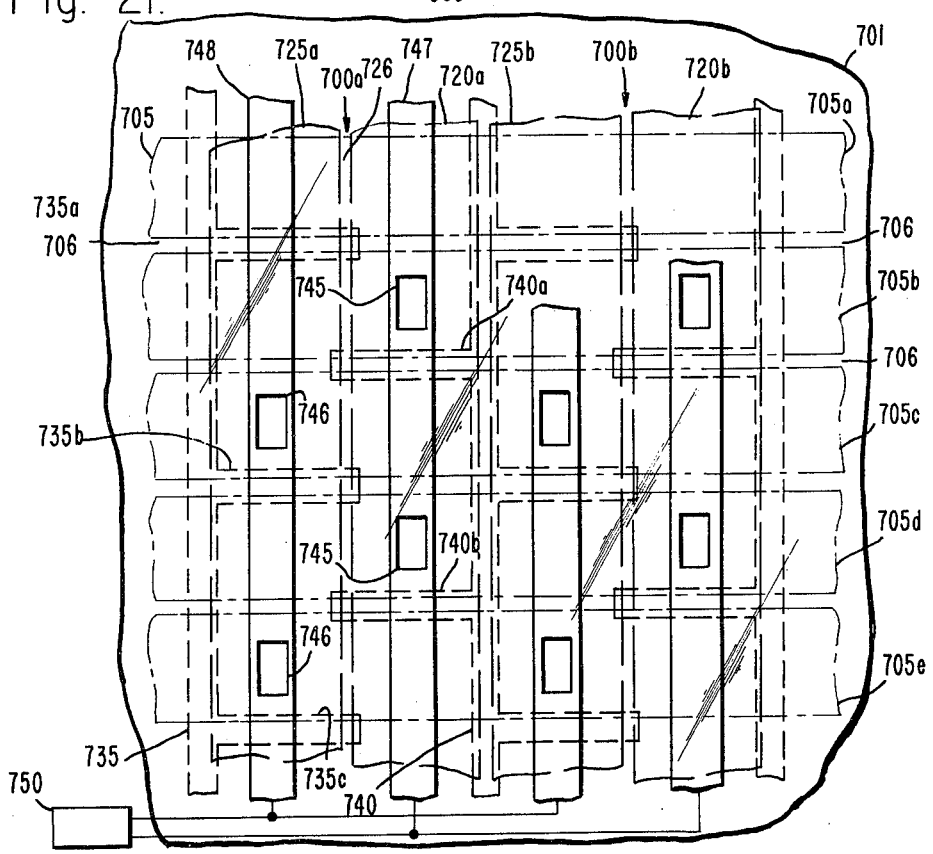
FIG. 21 is a plan view of the preferred embodiment of the present invention claimed in this application.

FIG. 21 illustrates a meander channel serial register 700a similar to the register 600 of FIG. 15 formed on a semiconductive substrate 701, and is the preferred embodiment of the present invention. The embodiment of FIG. 21 includes a pair of channel stops 735, 740 having pluralities of mutually interdigitated fingers 741, and 742, respectively which permit the plurality of discrete electrodes 620, 625 of FIG. 15 to be formed as single elongate electrodes 720, 725, respectively, as illustrated in FIG. 21. A first insulating layer of oxide is deposited over the substrate 701, over which a first layer of polysilicon is deposited to form a plurality of parallel lower level electrodes 705 extending across the register 700a separated by a plurality of insulating gaps 706. A second layer of oxide is deposited over the lower level electrodes 705, and a second layer of polysilicon is then deposited to form the parallel elongate upper level electrodes 720, 725 separated by an insulating gap 726 and extending across the lower level electrodes 705 along the entire length of the right and left hand portions, respectively, of the register 700a. The upper level electrodes 720, 725 span the gaps 706 between the lower level electrodes 705 in the right and left hand portions of the channel 700a respectively to stabilize charge transfer beneath these gaps. Likewise, the plurality of lower level electrodes 705 span the gap 726 between the upper level electrodes 720, 725 to stabilize charge transfer beneath the gap 726. The channel stop fingers 735a, 735b, 735c block charge flow beneath alternate gaps 706 between adjacent lower level electrodes 705 in the left hand portion of the channel 700a, while the channel stop fingers 740a, 740b block charge flow beneath the remaining gaps 706 in the right hand portion of the channel 700a. Charge flow beneath alternate gaps 706 between adjacent lower level electrodes 705 is controlled in the right and left hand portions of the channel 700a by the elongate electrodes 720 and 725, respectively.

Contacts 745 exposing both upper and lower level electrodes are formed in the right hand portion of channel 700a over alternate ones of the lower level electrode 705, while contacts 746 exposing both upper and lower level electrodes are formed in the left hand portion of channel 700 over remaining ones of the lower level electrodes 705 in the same manner as described above with reference to the contacts 631 and 632 of FIGS. 17 through 20. Elongate conductors 747, 748 are disposed over the plurality of contacts 745, 746 respectively and connected to clock pulse generator 750 to provide a two-phase CCD structure which operates to transfer charge in a meander path in the same manner described above with reference to FIGS. 16-21.

An identical register 700b is adjacent and parallel to the register 700a to make common use of the lower level electrodes 705 which extend over both of the registers 700a and 700b. The embodiment of FIG. 21 may include any number of parallel registers 700 to form a parallel memory useful in a series-parallel-series CCD memory in which charge is transferred through a plurality of parallel meander channel registers.

Although the various species and embodiments of the present invention have been described as formed on a semiconductive substrate of N-type conductivity, having overlying insulating layers of silicon dioxide and conductive layers of polycrystalline silicon to provide a two-phase P-channel CCD, it should be understood that a P-type substrate may be used to provide an N-channel CCD, the insulating layers may be any suitable dielectric film such as silicon nitride and the conductive layers may be any suitable conductor. Furthermore, the invention is not limited to the two-phase clocking system described, but may use any suitable clocking system, such as a four-phase system.

What is claimed is:

1. A charge coupled device formed on a semiconductor substrate for transferring charge in a meander path having right and left regions extending in a first direction in a plane, comprising:
   first insulated electrode means for controlling charge flow having a plurality of conductive portions, each of said portions extending in a second direction at least partially across said right and left regions;
   second insulated electrode means extending in said first direction, alternate pairs of adjacent ones of said first electrode means and said second electrode means at least partially overlapping for controlling charge flow in said right region;
   third insulated electrode means extending in said first direction, the remaining pairs of adjacent ones of said first electrode means and said third electrode means at least partially overlapping for controlling charge flow in said left region; and
   means for applying clock signals to selected ones of said first, second and third electrode means, wherein said second and third electrode means comprise a plurality of discrete electrodes, each of said discrete electrodes overlapping adjacent pairs of said first electrode means.

2. A charge coupled device formed on a semiconductive substrate for moving charge in a meander path comprising:
   a charge flow channel in said substrate extending in a first direction in a plane;
   a plurality of first electrode means for controlling charge flow in said channel disposed side-by-side, each extending in a second direction transverse to said first direction across said channel;
   a plurality of second electrode means for controlling charge flow in said channel overlying said channel, each extending in said first direction, alternate pairs of adjacent ones of said first electrode means and said second electrode means at least partially overlapping;
   a plurality of third electrode means for controlling charge flow in said channel offset in said second direction from said second electrodes means, each extending in said first direction, remaining pairs of adjacent ones of said first electrode means and said third electrode means at least partially overlapping; and
   means for applying clock signals to said first, second and third electrode means, wherein said second and third electrode means comprise a plurality of discrete electrodes, each of said discrete electrodes overlapping adjacent pairs of said first electrode means.

3. The device of claims 1 or 2 wherein said second and third electrode means are insulated from said first electrode means and extend in said first direction across said first electrode means.

4. A charge coupled device formed on a semiconductor substrate for transferring charge in a meander path having right and left regions extending in a first direction in a plane comprising:

first insulated electrode means for controlling charge flow having a plurality of conductive portions, each of said portions extending in a second direction at least partially across said right and left regions;

second insulated electrode means extending in said first direction, alternate pairs of adjacent ones of said first electrode means and said second electrode means at least partially overlapping for controlling charge flow in said right region;

third insulated electrode means extending in said first direction, the remaining pairs of adjacent ones of said first electrode means and said third electrode means at least partially overlapping for controlling charge flow in said left region;

means for applying clock signals to selected ones of said first, second and third electrode means, wherein said second and third electrode means comprise first and second pluralities of discrete electrodes, said first plurality of discrete electrodes overlapping alternate pairs of adjacent ones of said first electrode means, said second plurality of discrete electrodes overlapping the remaining pairs of adjacent ones of said first electrode means.

5. A charge coupled device formed on a semiconductive substrate for moving charge in a meander path comprising:

a charge flow channel in said substrate extending in a first direction in a plane;

a plurality of first electrode means disposed side-by-side, each extending in a second direction transverse to said first direction across said channel for controlling charge flow in said channel;

a plurality of second electrode means overlying said channel for controlling charge flow in said channel, each extending in said first direction, alternate pairs of adjacent ones of said first electrode means and said second electrode means at least partially overlapping;

a plurality of third electrode means for controlling charge flow in said channel offset in said second direction from said second electrode means, each extending in said first direction, remaining pairs of adjacent ones of said first electrode means and said third electrode means at least partially overlapping; and means for applying clock signals to said first, second and third electrode means, wherein said second and third electrode means comprise first and second pluralities of discrete electrodes, said first plurality of discrete electrodes overlapping alternate pairs of adjacent ones of said first electrode means, said second plurality of discrete electrodes overlapping the remaining pairs of adjacent ones of said first electrode means.

6. The device of claims 1, 2, 4 or 5 wherein said clock signal means comprise a first clock phase applied to said second electrode means and alternating ones of said first electrode means, and a second clock phase applied to said third electrode means and the remaining ones of said first electrode means.

7. The device of claims 1, 2, 4 or 5 wherein said clock signal means comprise a first clock phase applied to said second electrode means and alternate ones of said first electrode means, and a second clock phase applied to said third electrode means and the remaining ones of said first electrode means and further comprising first and second insulated conductors overlying said channel and connected to said first and second clock phases respectively, said first conductor extending in said first direction over one half of said channel and said second conductor extending in said first direction over the half of said channel.

8. The device of claims 1, 2, 4 or 5 wherein said clock signal means comprise a first clock phase applied to said second electrode means and alternating ones of said first electrode means, and a second clock phase applied to said third electrode means and the remaining ones of said first electrode means, said device further comprising first and second insulated conductors overlying said channel and connected to said first and second clock phases respectively, said first conductor extending in said first direction over one half of said channel and said second conductor extending in said first direction over the half of said channel, said device further comprising an insulating layer separating said first and second conductors from said electrode means.

9. A charge coupled device formed on a semiconductive substrate for transferring charge in a meander path having right and left regions extending in a first direction in a plane, comprising:

first insulated electrode means for controlling charge flow in said substrate having a plurality of conductive portions, each of said portions extending in a second direction at least partially across said right and left regions;

second insulated electrode means extending in said first direction, alternate pairs of adjacent ones of said first electrode means and said second electrode means at least partially overlapping for controlling charge flow in said right region;

third insulated elctrode means extending in said first direction, the remaining pairs of adjacent ones of said first electrode means and said third electrode means at least partially overlapping for controlling charge flow in said left region;

means for applying clock signals to selected ones of said first, second and third electrode means, wherein said clock signal means comprise a first clock phase applied to said second electrode means and to alternate ones of said first electrode means, and a second clock phase applied to said third electrode means and to the remaining ones of said first electrode means;

first and second insulated conductors overlying said channel and connected to said first and second clock phases respectively, said first conductor extending in said first direction over one half of said channel and said second conductor extending in said first direction over the remaining half of said channel;

an insulating layer separating said first and second conductors from said electrode means; and a plurality of contact means formed in said insulating layer, said contact means for connecting said first conductors to said second electrode means and to said alternate ones of said first electrode means, and another plurality of contact means formed in said insulating layer, said other contact means for connecting said second conductors to said third electrode means and to said remaining ones of said first electrode means.

10. A charge coupled device formed on a semiconductive substrate for moving charge in a meander path comprising:
- a charge flow channel in said substrate extending in a first direction in a plane;
- a plurality of first electrode means disposed side-by-side, each extending in a second direction tranverse to said first direction across said channel for controlling charge flow in said channel;
- a plurality of second electrode means overlying said channel for controlling charge flow in said channel, each extending in said first direction, alternate pairs of adjacent ones of said first electrode means and said second electrode means at least partially overlapping;
- a plurality of third electrode means for controlling charge flow in said channel offset in said second direction from said second electrode means, each extending in said first direction, remaining pairs of adjacent ones of said first electrode means and said third electrode means at least partially overlapping;
- means for applying clock signals to said first, second and third electrode means, wherein said clock signal means comprise a first clock phase applied to said second electrode means and alternate ones of said first electrode means, and a second clock phase applied to said third electrode means and the remaining ones of said first electrode means;
- first and second insulated conductors overlying said channel and connected to said first and second clock phase respectively, said first conductor extending in said first direction over one half of said channel and said second conductor extending in said first direction over the other half of said channel;
- an insulating layer separating said first and second conductors from said electrode means; and
- a plurality of contact means formed in said insulating layer, said contact means connecting said first conductors to said second electrode means and to said alternate ones of said first electrode means, and another plurality of contact means formed in said insulating layer, said other contact means for connecting said second conductors to said third electrode means and to said remaining ones of said first electrode means.

11. The device of claims 1, 2, 4, 5, 9 or 10 wherein said first electrode means comprise a first conductive layer on said substrate, and said second and third electrode means comprise a second conductive layer on said substrate overlying said first layer and insulated therefrom.

12. The device of claims 1, 2, 4, 5, 9 or 10 wherein said first electrode means comprise a first conductive layer on said substrate, and said second and third elctrode means comprise a second conductive layer on said substrate overlying said first layer and insulated therefrom, and wherein said first electrode means create underlying potential wells in said channel in which charge may be stored.

13. The device of claims 1, 2, 4, 5, 9 or 10 wherein said plurality of first electrode means face one another along gaps extending in said second direction therebetween.

14. The device of claims 1, 2, 4, 5, 9 or 10 further comprising of channel stop means for blocking charge flow in said first direction in said channel (a) beneath said second electrode means and alternate adjacent pairs of the first electrode means and (b) beneath said third electrode means and remaining adjacent pairs of the first electrode means.

* * * * *